(12) United States Patent
Liao et al.

(10) Patent No.: US 6,278,627 B1
(45) Date of Patent: Aug. 21, 2001

(54) MULTIPLE INPUT BIT-LINE DETECTION WITH PHASE STEALING LATCH IN A MEMORY DESIGN

(75) Inventors: Kevin Liao; Joel D. Lamb; Christopher A. Poirier, all of Fort Collins, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/504,138

(22) Filed: Feb. 15, 2000

(51) Int. Cl.[7] ....................................................... G11C 5/06
(52) U.S. Cl. .................. 365/63; 365/230.01; 365/230.05
(58) Field of Search ............................... 365/63, 230.05, 365/230.01, 241, 203, 233

(56) References Cited

U.S. PATENT DOCUMENTS

| | | | |
|---|---|---|---|
| 5,142,494 | * 8/1992 | D'Luna ............................ | 365/189.02 |
| 5,646,893 | * 7/1997 | McMinn et al. ................. | 365/189.05 |
| 6,097,618 | * 8/2000 | Jenne ............................... | 365/63 |
| 6,128,224 | * 10/2000 | Morton et al. ................... | 365/185.18 |

* cited by examiner

*Primary Examiner*—David Nelms
*Assistant Examiner*—Thong Le
(74) *Attorney, Agent, or Firm*—Blakely, Sokoloff, Taylor & Zafman LLP

(57) ABSTRACT

A method and apparatus are provided for sensing and temporarily latching data signals from memory cells. According to one embodiment, data signals are sensed from memory cells and temporarily latched on an output signal. During a first phase of a clock cycle, multiple input bit-lines are precharged. Subsequently, a discharged input bit-line is sensed during a second phase of the clock cycle. Responsive to the sensing step, the output signal is set to a first state and maintained for at least one clock cycle. According to another embodiment, a multiple input bit-line detecting circuit includes multiple input bit-lines, precharge logic, and output logic. The multiple input bit-lines are configured to be coupled to a bit-line hierarchy of a memory device. The precharge logic is coupled to each of the input bit-lines and is configured to precharge each of the input bit-lines during a first phase of a clock cycle. The output logic is operatively coupled to the multiple input bit-lines to set an output signal to a first state and maintain the first state on the output signal for at least one clock cycle in response to one or more of the input bit-lines being discharged.

24 Claims, 7 Drawing Sheets

MULTIPLE INPUT BIT-LINE DETECTION WITH PHASE STEALING LATCH IN A MEMORY DESIGN

FIELD OF THE INVENTION

This invention relates to the field of memory devices and embedded memories in general, and more specifically to sensing data signals from memory cells and temporarily latching a high speed memory output.

BACKGROUND OF THE INVENTION

Read Only Memory (ROM) is used in various devices ranging from calculators to mainframe computer systems. Normally, ROM is used to store critical instructions or data for use by a processor. An example of such instructions would be system boot up instructions. The processor can access these instructions or data by supplying an address to the memory. The instructions are then supplied by the memory to the processor for execution.

FIG. 1 is a block diagram illustrating a typical block of ROM. Here, the block of ROM 100 is divided into three segments 101, 102 and 103. Each of these segments may represent a range of addresses. For example, segment 101 may represent addresses from 0 to 255, segment 102 may represent addresses 256 to 511, and segment 103 may represent addresses 512 to 767. The block of ROM 100 is accessed through an address bus 104. Data is then read from the appropriate address in the ROM and output on the data bus 105.

FIG. 2 is a simplified schematic illustrating the details of a ROM design and the implementation of a prior art sensing gate and latch. A typical ROM circuit consists of an address detection gate 201 connected to each word-line 205. Typically, a word-line such as word-line 205 will contain a number of bit-lines 203 and 207. Further, memory contains a number of word-lines such as illustrated here by word-lines 205, 206, and 208. Each bit-line is connected to a gate 209 which in turn drives an output 210.

A decoded address is provided on address lines 200. This address is detected by a gate 201 attached to a word-line. If the word-line is selected, the selected cell 202 will then be discharged. The discharge of this bit-line 203 will then be passed through a gate 209 to the output 210. In the prior art, this output 210 may then applied to a sensing gate 211. In some applications this sensing gate may have more than one bit-line applied to the inputs such as 210 and 213. If the output of this sensing gate 211 is required to remain on for more than a single clock cycle, it could be latched by an external latch 212.

Normally, an address is supplied to a ROM and data from that address must be supplied within one clock cycle. As processor speed increases, the time in which a ROM must supply data decreases. Several solutions have been provided to address this problem. One solution was to divide one bit-line into two. This method reduced the capacitance of the individual lines allowing for quicker discharge of the cell. This discharge could then be latched by an external latch to prolong the signal through an entire clock cycle. However, this external latch increased circuit complexity and slowed down overall response times. As processor speeds increase, this solution becomes less effective.

SUMMARY OF THE INVENTION

According to one embodiment, data signals are sensed from memory cells and temporarily latched on an output signal. During a first phase of a clock cycle, multiple input bit-lines are precharged. Subsequently, a discharged input bit-line is sensed during a second phase of the clock cycle. Responsive to the sensing step, the output signal is set to a first state and maintained for at least one clock cycle. Advantageously, in this manner, a multiple input bit-line detection circuit provides quick response and prolongs output of data from an addressed memory cell without the complexity and negative effects of prior approaches that must employ an external latch.

Other features and advantages of the invention will be apparent from the accompanying drawings and from the detailed description.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

A method and apparatus are described for temporarily latching a high speed memory output. According to one embodiment of the present invention, this method and apparatus consist of circuitry internal to a memory device which precharges each of a plurality of bit-lines, discharges an addressed bit-line when a corresponding input goes low, senses a discharged bit-line, and maintains a low output from the discharged bit-line until the input corresponding to the addressed bit-line goes high and a clock input goes high. This method allows for quick ROM response and prolongs output of the ROM data through an entire clock cycle without the complexity and negative effects of an external latch. Therefore, this method provides for a less complex circuit with faster response times.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Importantly, while embodiments of the present invention will be described with reference to a read only memory, the method and apparatus described herein are equally applicable to other types of memory devices. For example, the techniques described herein are useful in connection with random access memory.

Figure 3:
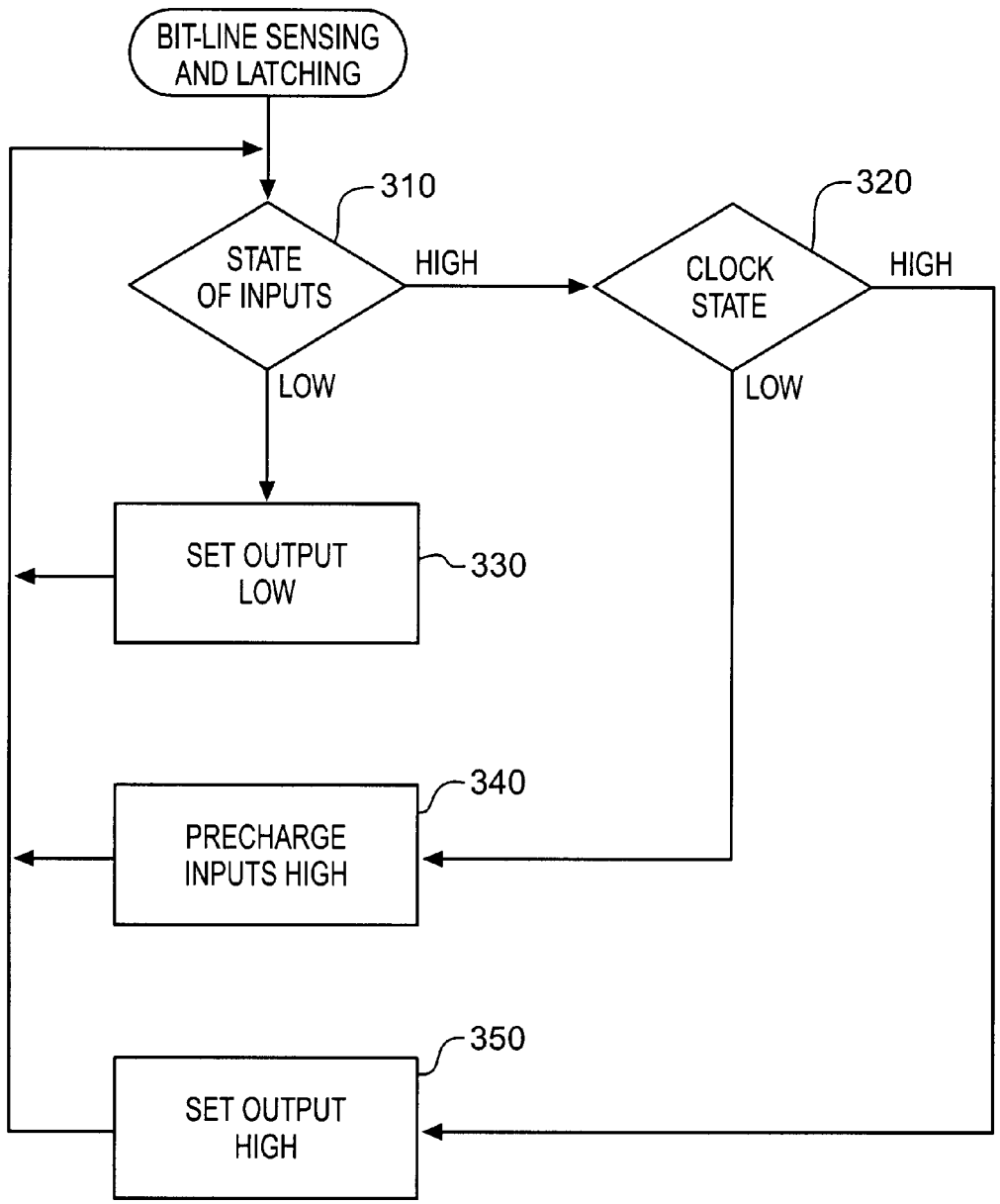
FIG. 3 is a flow chart illustrating memory sensing and latching according to one embodiment of the present invention.

FIG. 3 is a flow chart illustrating memory sensing and latching according to one embodiment of the present invention. First, if any input is low 310, the output is set low 330. If the inputs are all high 310 the state of the clock is checked 320. If the clock is high 320, the outputs are set high 350. If the clock is low 320, the inputs are precharged 340. Therefore, if an input goes low the output will go low. Once the input goes high and the clock is low, the input will be precharged. However, the output will remain low until the clock goes high.

Figure 4:
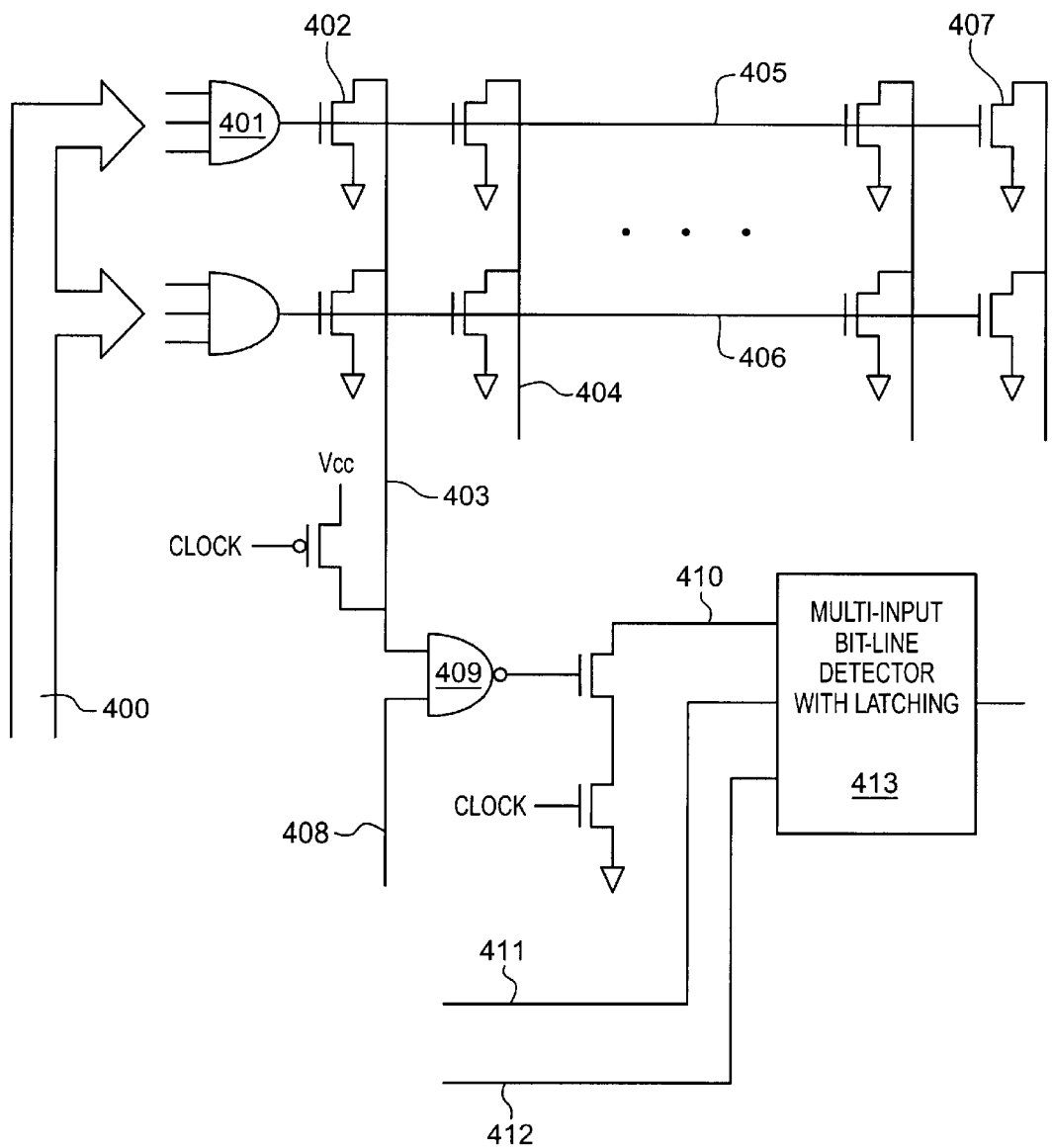
FIG. 4 is a simplified schematic of a ROM circuit illustrating one implementation of the present invention.

FIG. 4 is a simplified schematic of a ROM circuit illustrating one implementation of the present invention. A typical ROM circuit consists of an address detection gate 401 connected to each word-line 405. Typically, a word-line such as word-line 405 will contain a number of bit-lines 403 and 407. Further, memory contains a number of word-lines such as illustrated here by word-lines 405, 406, and 408. Each bit-line is connected to a gate 409 which in turn drives an output 410.

Figure 1:
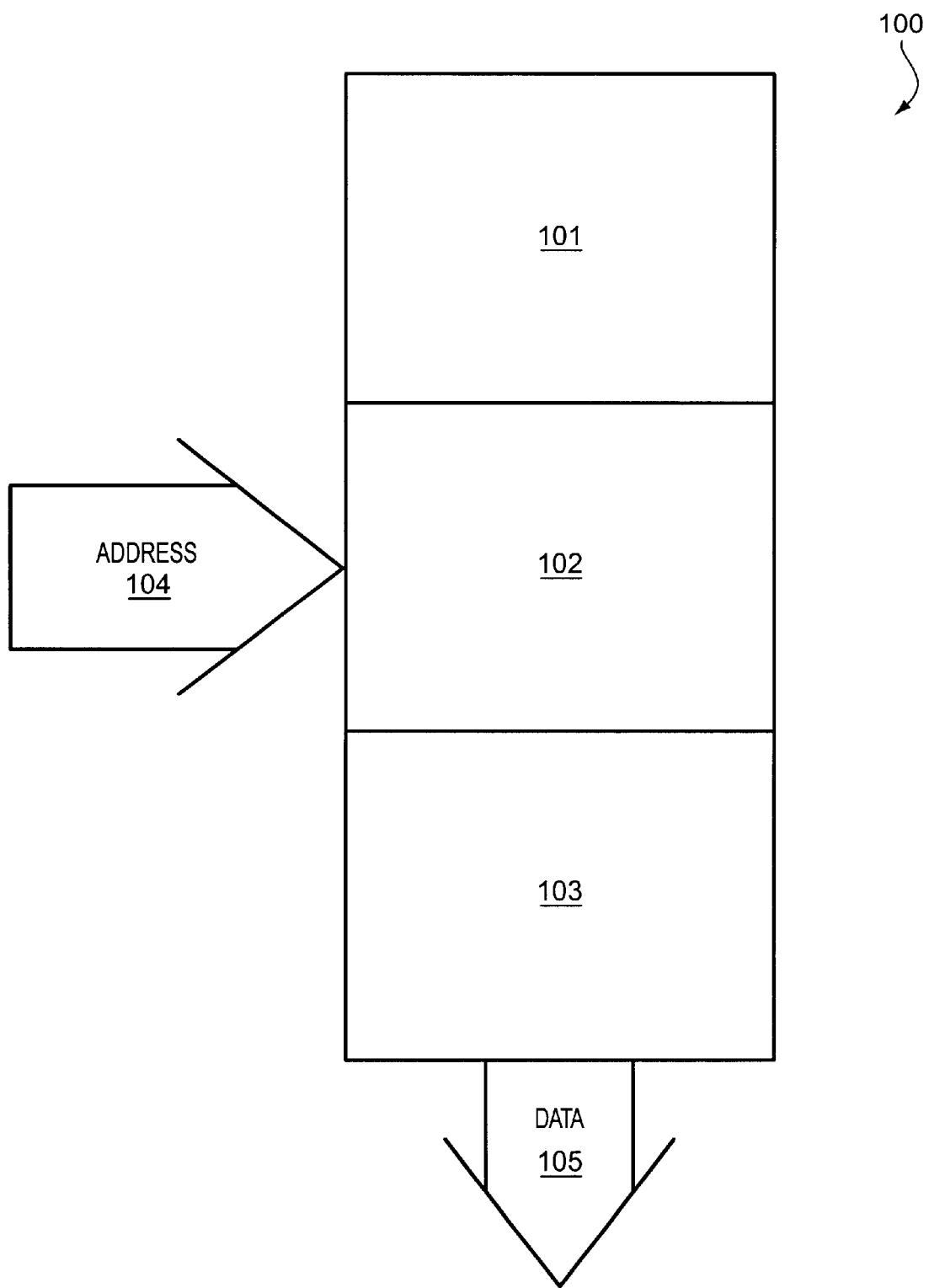
FIG. 1 is a block diagram illustrating a typical block of read only memory (ROM)
Figure 2:
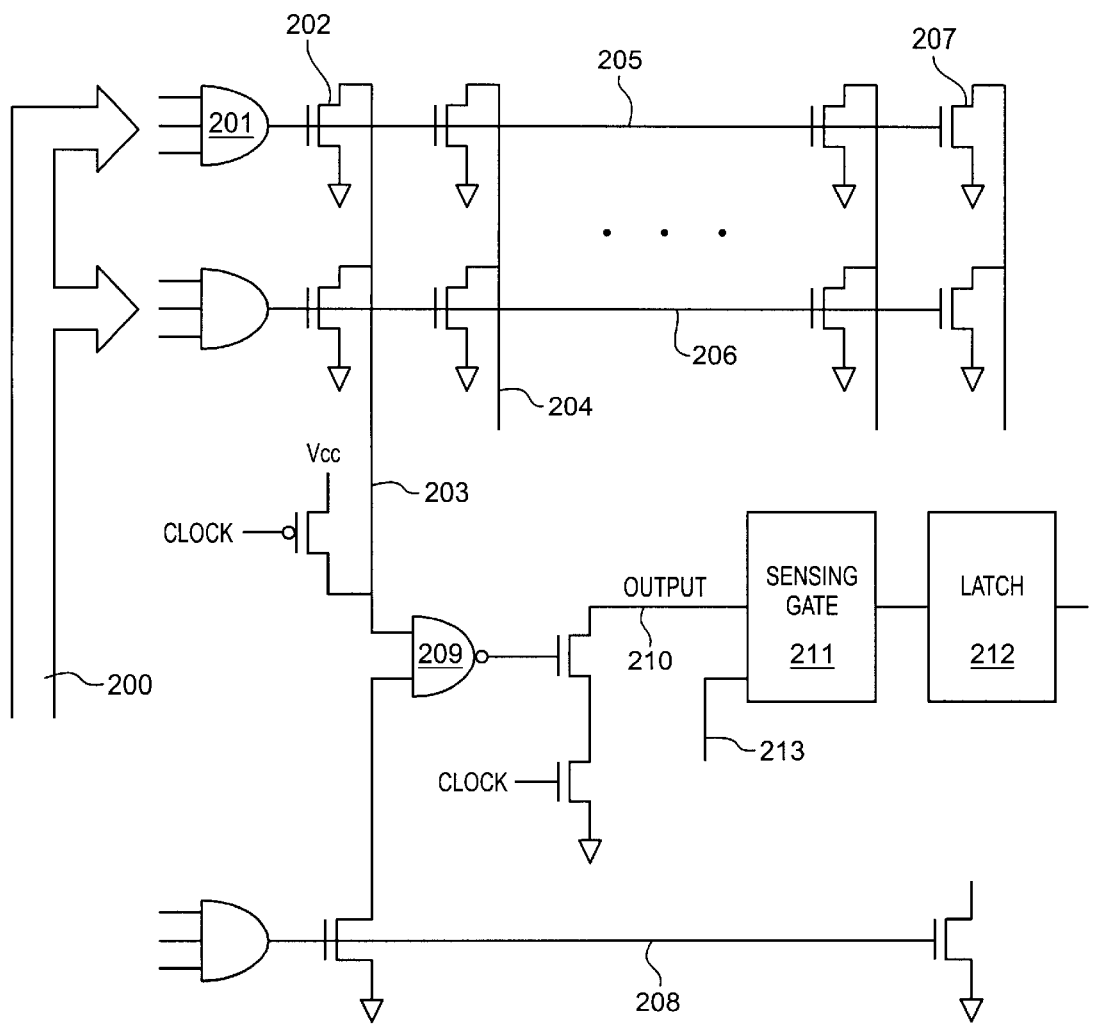
FIG. 2 is a simplified schematic illustrating the details of a ROM design and the implementation of a prior art sensing gate and latch.

A decoded address is provided on address lines 400. This address is detected by a gate 401 attached to a word-line. If the word-line is selected, the selected cell 402 will then be discharged. The discharge of this bit-line 403 will then be passed through a gate 409 to the output 410. As seen in FIG. 2, in the prior art this output 210 may then applied to a sensing gate 211 and external latch 212. According to one aspect of the present invention, the output 410 can be supplied to a multi-input bit-line detector 413 along with other bit-lines 411 and 412. This multi-input bit-line detector then performs both the sensing and latching functions. The details of the multi-input bit-line detector will be described below.

Figure 5:
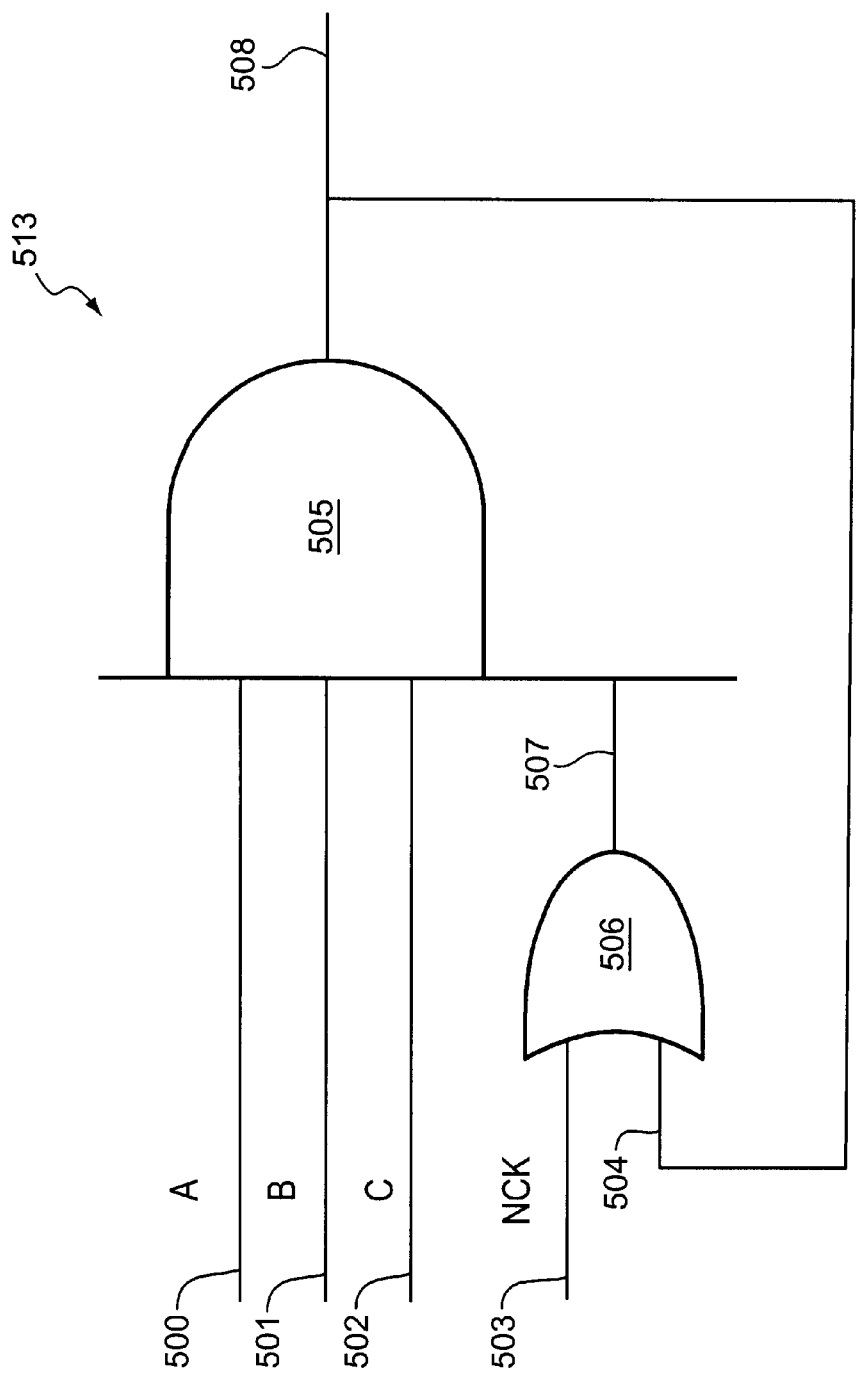
FIG. 5 is a logic diagram that conceptually illustrates multiple bit-line sensing and latching according to one embodiment of the present invention.

FIG. 5 is a logic diagram that conceptually illustrates multiple bit-line sensing and latching according to one embodiment of the present invention. In this example, the multi-input bit-line detector with latch 513 includes an AND gate 505 and an OR gate 506. First, inputs 500, 501, and 502 are precharged high. Once the clock (NCK) 503 goes high, the output of the OR gate 507 is toggled on. Since inputs 500, 501, and 502 have been precharged and the output of OR gate 507 is now on, the output of the AND gate 508 is now toggled on. This output 508 is fed back to one input of the OR gate 504. Since all three inputs 500, 501, and 502 are precharged and one input 504 of the OR gate 506 is on, the AND gate 505 will continue to output a high signal. This stable state will be maintained until one of the inputs 500, 501, and 502 goes low regardless of the state of the clock 503. This is in contrast to a normal latching circuit which will only catch low inputs or falling edges when the clock is high.

Once one of the inputs 500, 501, or 502 goes low, the output of the AND gate 508 changes state to low, the output of the AND gate 508 is fed back to the OR gate 504. With one of the inputs 504 to the OR gate 506 low, the output of the OR gate 507 will now toggle with the state of the clock 503. Therefore, the output 508 of the AND gate 505 remains low until all the inputs 500, 501 and 502 and the clock 503 are high.

Once the clock input 503 goes low, all inputs 500–502 are recharged. Meanwhile, the output 508 of the AND gate 505 remains low as long as the output of the OR gate 506 remains low. Therefore, the output 508 of the AND gate 505 will remain low until the clock 503 goes high. Once the clock 503 goes high the output of the OR gate 507 goes high. Since inputs 500, 501, and 502 have been precharged and the output of the OR gate 507 is now high the output 508 of the AND gate 505 will now go high. The output 508 of the AND gate 505 will then remain high regardless of the state of the clock 503 until one of the inputs 500, 501, or 502 again discharges.

Figure 6:
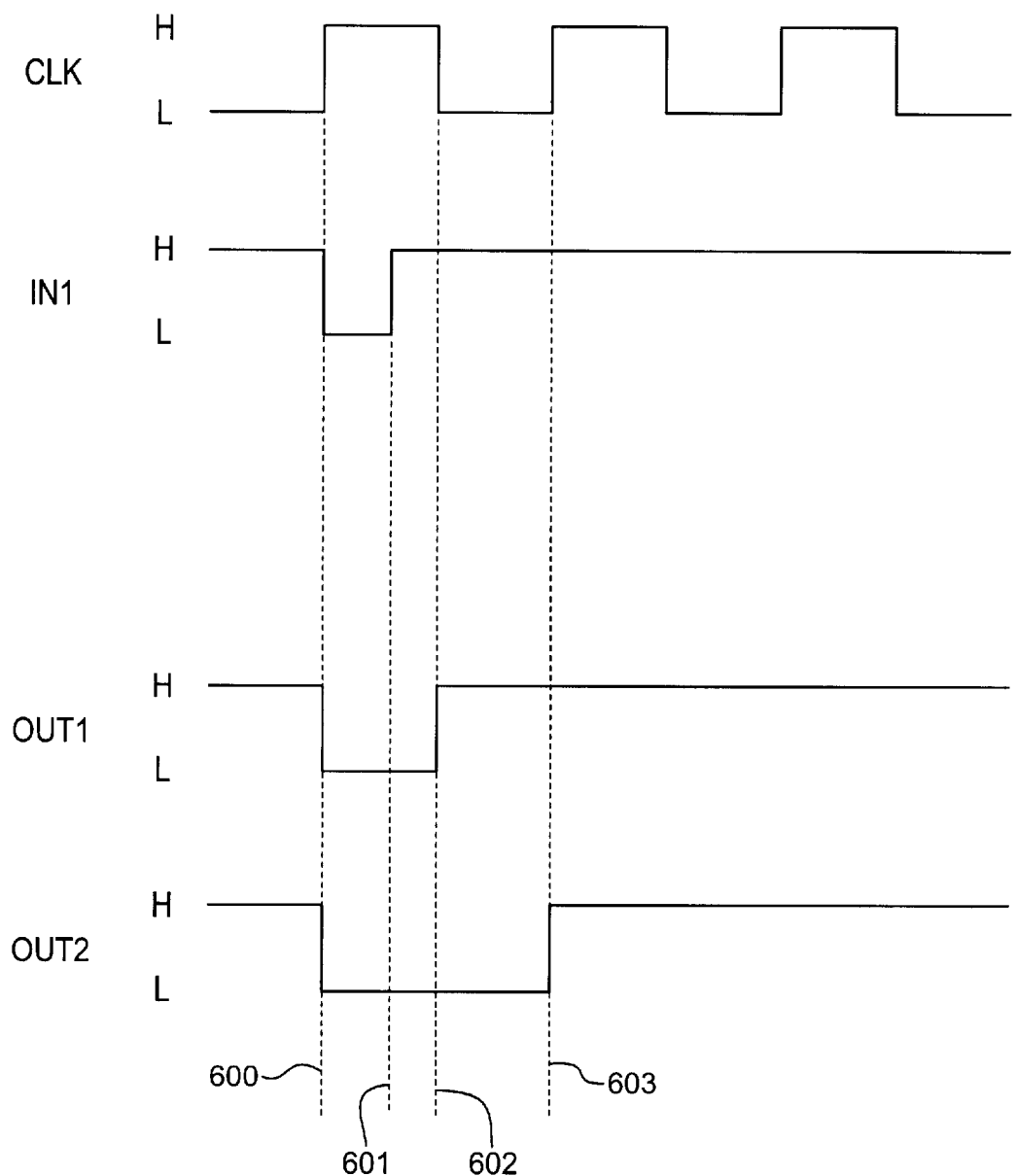
FIG. 6 is a timing chart illustrating multiple bit-line sensing and latching according to one embodiment of the present invention.

FIG. 6 is a timing chart illustrating multiple bit-line sensing and latching according to one embodiment of the present invention. Here, OUT1 represents the output of a prior art sensing gate without an external latch and OUT2 represents the output of the multi-input bit-line detector with latch according to one embodiment of the present invention. The first event 600 is input IN1 changing from high to low. At this time the outputs OUT1 and OUT 2 also go low. Next 601, the input IN1 goes high again but OUT1 and OUT2 remain low. Next 602, the clock CLK goes from low to high. At this point 602, OUT1 also goes high but OUT2 remains low. At the end of the normal clock cycle 602 the clock CLK transitions from high to low but the output OUT2 continues to be low. Advantageously, in this manner, the value sensed is effectively latched on the output for a full clock cycle, thereby eliminating the need for an external latch as required by the prior art as illustrated by OUT1. Finally, at the beginning of the next clock cycle 603, the output OUT2 changes from low to high.

Figure 7:
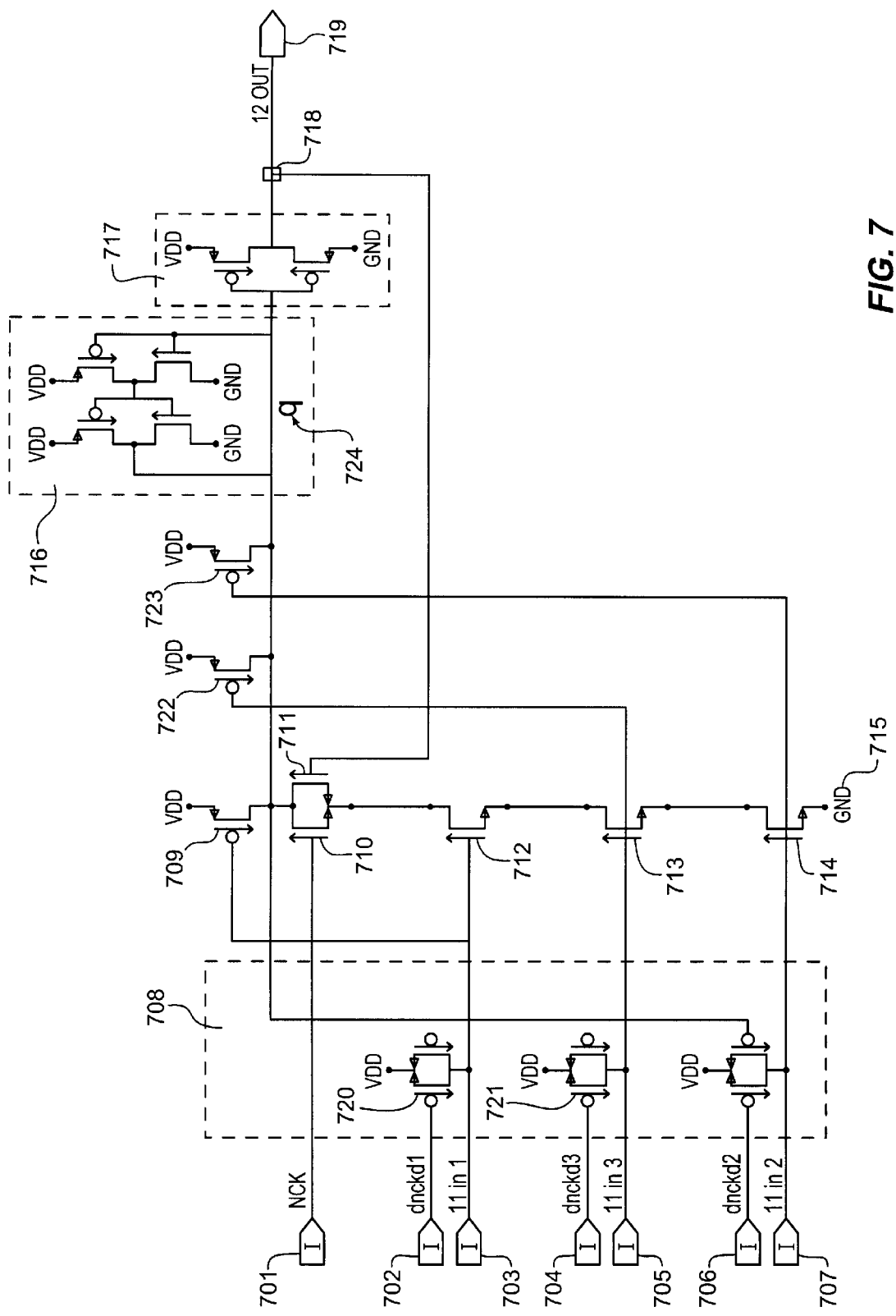
FIG. 7 is a detailed schematic illustrating a multiple bit-line sensing and latching circuit according to one embodiment of the present invention.

FIG. 7 is a detailed schematic illustrating a multiple bit-line sensing and latching circuit according to one embodiment of the present invention. Here, input NCK 701 is a clock signal. Inputs 703, 705, and 707 are precharged bit-lines. Inputs 702, 704, and 706 are clock signals which are similar to the NCK waveform except that they are delayed. Each input 703, 705, and 707 has a transistor pair connected to it 708. These pairs 708 function as a precharger and keeper for each input. For example, the PFET 720 connected to input 702 functions as a precharger and the PFET 721 connected to the input 702 functions as a keeper.

This circuit also includes an NFET connected to each input 712, 713, and 714. Together these three NFETS function as a three input NAND gate. Also connected to each input 703, 705, and 707 are three PFET pull up transistors 709, 722, and 723. Also included in this circuit is a full keeper 716 and a driver 717. The full keeper 716 consists of back to back inverters which maintain the state of the output when all of the inputs 712, 713, and 714 are high and the clock 701 is low. The driver 717 consists of a PFET and NFET pair and functions as an inverter as well as a driver.

In a stable state, all inputs 703, 705, and 707 are precharged and remain high. The clocks 701, 702, 704, and 706 all toggle at a given frequency. All inputs 703, 705, and 707 are high and all of the pull down NFETS 712, 713, and 714 are on. Once the NCK clock 701 goes high, the NFET connected to NCK 710 turns on. At this point a path is created between node q 724 and ground 715 through NFETs 710, 712, 713, and 714. Since the output driver 717 is an inverter, the output 719 will now be on. The high state of the output 719 will then be fed back through the line connected to the output 718 to the NFET 711. With this NFET 711 on the toggling of the NCK clock 701 will have no effect on the state of the output 719. This stable state will be maintained until one of the inputs 703, 705, or 707 discharge.

When one of the inputs 703, 705, or 707 goes low or discharges, the output 719 will then go low. For example assume that input 703 goes low. At that time, the NFET 712 connected to input 703 will turn off. This opens the path from the output 719 through NFETS 711, 712, 713, and 714 to ground 715. Therefore, the full keeper 716 can be charged. At the same time the PFET 709 connected to input 703 turns on. Once this PFET 709 turns on, node q 724 will be pulled high. Once the full keeper 716 is charged, the output 719, through the driver 717 will be changed to low.

Once the delayed clock signal 702 goes low the precharger 720 starts to charge. After precharger 720 has charged and delayed clock signal 702 goes high, keeper 721 will hold input 703 high. After the input 703 has been precharged, the NFET 712 connected to input 703 can be turned on. However, while clock NCK 701 is still low, the NFET 710 connected to clock NCK 701 will still be off. While this NFET 710 is still off, no path to ground 715 can be established. Therefore, while clock NCK 701 is still low node q 724 cannot be discharged and the output 719 cannot turn on. When the clock NCK 701 goes high the NFET 710 connected to clock NCK 701 will turn on. This completes a path which allows node q 724 to discharge through NFETs 710, 712, 713, and 714 to ground 715. Once node q 724 has been discharged, the driver 717 will turn on the output 719. The high state of the output 719 will then be fed back to the NFET 711 connected to the output 719 through point 718. With NFET 711 now turned on, the path to ground through NFETs 711, 712, 713, and 714 will be maintained regardless of the state of clock NCK 701. This stable state will then be maintained until one of the inputs 703, 705, or 707 is again discharged.

An additional feature of the circuit illustrated in FIG. 7 is provided by the NFET pair consisting of NFETs 710 and 711. These NFETs 710 and 711 are placed at the top of the pull down path to prevent possible leakage problems. The same NFET pair 710 and 711 could be placed at the bottom of the pull down path and the circuit would function in the same manner. However, if the pair 710 and 711 was located at the bottom of the pull down path, for example, between NFET 714 and ground 715, the full keeper may not be able to maintain a charge and hold the output low through the period required. By placing the NFET pair 710 and 711 at the top of the pull down path the charge time required is slightly longer but the latch function is more reliable.

The effect of this circuit is to sense data signals from memory cells and temporarily latch a high speed memory output. This circuit allows for quick ROM response and prolongs output of the ROM data through an entire clock cycle without the complexity and negative effects of an external latch.

What is claimed is:

1. A method of performing multiple bit-line detection comprising:
    precharging each of at least three bit-lines associated with a bit-line hierarchy of a memory device during a first phase of a clock cycle;
    sensing a discharged bit-line of the at least three bit-lines during a second phase of the clock cycle;
    setting an output signal to a first state in response to the sensing; and
    maintaining the first state on the output signal until the beginning of a successive clock cycle.

2. The method of claim 1, further comprising:
    setting the output signal to a second state in response to the clock transitioning from the first phase to the second phase; and
    maintaining the second state on the output signal until one or more of the at least three bit-lines are discharged.

3. The method of claim 1, wherein said precharging, said sensing, and said maintaining are performed by the same circuit.

4. The method of claim 1, further comprising evaluating the output signal during the first phase.

5. The method of claim 1, further comprising evaluating the output signal during the second phase.

6. A multiple input bit-line detecting circuit comprising:
    a plurality of input bit-lines configured to be coupled with a bit-line hierarchy of a memory device;
    precharge logic coupled with each of the plurality of input bit-lines, the precharge logic precharging each of the plurality of input bit-lines during a first phase of a clock cycle; and
    output logic operatively coupled with the plurality of input bit-lines to set an output signal to a first state and maintain the first state on the output signal until the beginning of a successive clock cycle in response to one or more of the at least three input bit-lines being discharged.

7. The multiple input bit-line detecting circuit of claim 6, wherein the output logic includes a full keeper and a driver coupled to the output signal.

8. The multiple input bit-line detecting circuit of claim 6, wherein the precharge logic includes a precharge P-type field-effect transistor (PFET) and keeper PFET pair of each of the plurality of input bit-lines.

9. The multiple input bit-line detecting circuit of claim 6, wherein the plurality of input bit-lines comprise three input bit-lines.

10. A multiple input bit-line detecting circuit comprising:
    a plurality of input bit-lines;
    precharge means coupled with each of the plurality of input bit-lines, for precharging each of the plurality of input bit-lines during a first phase of a clock cycle; and
    output means operatively coupled with the plurality of input bit-lines for setting an output signal to a first state and maintaining the first state on the output signal until the beginning of a successive clock cycle in response to one or more of the plurality of input bit-lines being discharged.

11. The multiple input bit-line detecting circuit of claim 10, wherein the output means includes a full keeper and a driver coupled to the output signal.

12. The multiple input bit-line detecting circuit of claim 10, wherein the precharge means includes a precharge P-type field-effect transistor (PFET) and keeper PFET pair for each of the plurality of input bit-lines.

13. An apparatus comprising:
    a memory-cell array;
    a bit-line hierarchy coupled with the memory cell array; and
    a plurality of multiple input bit-line detecting circuits each including
        a plurality of input bit-lines coupled with the bit-line hierarchy,
        precharge logic coupled with each of the plurality of input bit-lines, the precharge logic precharging each of the plurality of input bit-lines during a first phase of a clock cycle, and
        output logic operatively coupled with the plurality of input bit-lines to set an output signal to a first state and maintain the first state on the output signal until the beginning of a successive clock cycle in response to one or more of the plurality of input bit-lines being discharged.

14. The apparatus of claim 13, wherein the memory-cell array comprises a plurality of random access memory (RAM) cells.

15. The apparatus of claim 13, wherein the memory-cell array comprises a plurality of read only memory (ROM) cells.

16. A multiple input bit-line detecting circuit comprising:
at least three input bit-lines configured to be coupled with a bit-line hierarchy of a memory device;
precharge logic coupled with each of the at least three input bit-lines, the precharge logic precharging each of the at least three input bit-lines during a first phase of a clock cycle; and
output logic operatively coupled with the at least three input bit-lines to set an output signal to a first state and maintain the first state on the output signal until the beginning of a successive clock cycle in response to one or more of the at least three input bit-lines being discharged.

17. The multiple input bit-line detecting circuit of claim 16, wherein the output logic includes a full keeper and a driver coupled to the output signal.

18. The multiple input bit-line detecting circuit of claim 16, wherein the precharge logic includes a precharge P-type field-effect transistor (PFET) and keeper PFET pair for each of the at least three input bit-line.

19. A multiple input bit-line detecting circuit comprising:
at least three input bit-lines;
precharge means coupled with each of the at least three input bit-lines, for precharging each of the at least three input bit-lines during a first phase of a clock cycle; and
output means operatively coupled with the at least three input bit-lines for setting an output signal to a first state and maintaining the first state on the output signal until the beginning of a successive clock cycle in response to one or more of the at least three input bit-lines being discharged.

20. The multiple input bit-line detecting circuit of claim 19, wherein the output means includes a full keeper and a driver coupled to the output signal.

21. The multiple input bit-line detecting circuit of claim 19, wherein the precharge means includes a precharge P-type field-effect transistor (PFET) and keeper PFET pair for each of the at least three input bit-lines.

22. An apparatus comprising:
a memory-cell array;
a bit-line hierarchy coupled with the memory cell array; and
a plurality of multiple input bit-line detecting circuits each including
at least three input bit-lines coupled with the bit-line hierarchy,
precharge logic coupled with each of the at least three input bit-lines, the precharge logic precharging each of the at least three input bit-lines during a first phase of a clock cycle, and
output logic operatively coupled with the at least three input bit-lines to set an output signal to a first state and maintain the first state on the output signal until the beginning of a successive clock cycle in response to one or more of the at least three input bit-lines being discharged.

23. The apparatus of claim 22, wherein the memory-cell array comprises a plurality of random access memory (RAM) cells.

24. The apparatus of claim 22, wherein the memory-cell array comprises a plurality of read only memory (ROM) cells.

\* \* \* \* \*